United States Patent [19]

Schroter

[11] Patent Number: 5,068,872

[45] Date of Patent: Nov. 26, 1991

[54] APPARATUS AND METHOD FOR SHORT CYCLING SEQUENCES OF A P-CODE GENERATOR

[75] Inventor: John C. Schroter, Waltham, Mass.

[73] Assignee: Raytheon Company, Lexington, Mass.

[21] Appl. No.: 441,855

[22] Filed: Nov. 27, 1989

[51] Int. Cl.$^5$ .................. G06F 1/02; H03B 29/00; H04L 27/30
[52] U.S. Cl. .................................. 375/1; 380/46; 380/47; 364/717; 331/78
[58] Field of Search .............. 375/1; 380/46, 50, 44, 380/47, 48; 364/717; 331/78

[56] References Cited

U.S. PATENT DOCUMENTS

| | | | |
|---|---|---|---|
| 3,728,533 | 4/1973 | Matthews | 364/717 X |
| 4,611,183 | 9/1986 | Piosenka et al. | 331/78 |
| 4,754,465 | 6/1988 | Trimble | 375/1 |
| 4,785,410 | 11/1988 | Hamatsu et al. | 364/717 |
| 4,821,294 | 4/1989 | Thomas, Jr. | 375/96 |
| 4,827,514 | 5/1989 | Ziolko et al. | 380/48 |
| 4,847,862 | 7/1989 | Braisted et al. | 375/1 |

Primary Examiner—Bernarr E. Gregory
Attorney, Agent, or Firm—Walter F. Dawson; Richard M. Sharkansky

[57] ABSTRACT

An improved short cycled sequencer of a P-code generator is disclosed for generating a ranging code in a Global Positioning System receiver. A shift register in the sequencer has a predetermined number of stage outputs exclusive-ored with a decoded outpout of the shift register stages and the exclusive-ored output is fed back to the serial input of the shift register. At the end of sequencing through a plurality of vectors, reinitialization of the shift register occurs without having to load an initialization vector from an external source.

13 Claims, 7 Drawing Sheets

APPARATUS AND METHOD FOR SHORT CYCLING SEQUENCES OF A P-CODE GENERATOR

BACKGROUND OF THE INVENTION

This invention relates to digital signal processing and in particular to an apparatus and method for short cycling sequences of a precision (P) code generator in a signal processor of a Global Positioning System (GPS) receiver.

The Global Positioning System (GPS) is a navigation system based on eighteen satellites in orbit. When fully operational the eighteen satellites will be evenly dispersed in three, inclined, 12-hour circular orbits chosen to ensure continuous 24-hour coverage. The GPS will provide extremely accurate three-dimensional position and velocity information to users anywhere in the world. Normally, four satellites are required for precise location determination in four dimensions (latitude, longitude, altitude and time). The location determinations are based on measurement of the transit time of RF signals from the satellites selected from the total of eighteen. Each satellite transmits a pair of L-band carrier signals, an L1 signal at 1575.42 MHz and on L2 signal at 1227.6 MHz. The L1 and L2 signals are bi-phased modulated by two pseudo-random noise (PRN) codes; a P-code provides for precision measurement of transit time and a C/A (coarse/acquisition) code provides for a coarse measurement of transit time and provides for easy lock-on to the desired signal suitable for many commercial purposes.

The P-code is the principal navigation pseudo-random noise (PRN) ranging code of the Global Positioning System. The P-code is a repetitive sequence of bits referred to as chips (in spread spectrum parlance). The P-code generator in a NAVSTAR GPS receiver reproduces the P-code that is generated by a P-code generator of a particular NAVSTAR GPS satellite and each satellite produces a unique P-code. However, the design of the P-code generator in a receiver of a user can vary as long as the P-codes generated are the same as those of the satellites. The conventional P-code generator comprises four shift-register stages, each stage including input registers and multiplexing for storing and gating initialization state vector words into the shift registers.

New applications of the GPS system have identified the need for a GPS receiver having a signal processor implemented on a very large scale integrated (VLSI) circuit. In order to accomplish this level of integration, the signal processor has to be designed with minimum circuitry to facilitate getting it on a VLSI circuit chip. The manner in which the invention causes a circuitry reduction in a stage of the P-code generator, resulting in a quadruple reduction per signal processor channel in a portion of the P-code generator, will be understood as this specification proceeds.

SUMMARY OF THE INVENTION

A P-code generator of a Global Positioning System is provided comprising a plurality of pseudo-random number generators interconnected to generate a ranging P-code. Each of such generators comprises an improved sequencer wherein short cycling of such sequencer is accomplished with less circuitry for generating an initial vector word upon reinitialization of the sequencer.

In accordance with the present invention a pseudo-random number generator is provided comprising shift register means including a plurality of stages and having a serial input, a serial output and shifting in accordance with an input signal, decoder means coupled to an output of each stage of the shift register means for generating a decode signal when the contents of the shift register equals a predetermined vector word, and means coupled to the decode signal and the outputs of a plurality of predetermined stages of the shift register means for generating a feedback signal coupled to the serial input of the shift register means to short cycle the pseudo-random number generator. The shift register means is preloaded with an initial vector word. The feedback signal generating means comprises an exclusive-OR gate.

In accordance with a further feature of the invention a P-code generator of a Global Positioning System is provided comprising a plurality of pseudo-random number generators for generating a ranging P-code, each of the generators having a sequencer means for determining the ranging P-code, shift register means included in each of the sequencer means comprising a plurality of stages, the shift register means having a serial input, a serial output, and shifting in accordance with an input signal, decoder means coupled to an output of each stage of the shift register means for generating a decode signal when the contents of the shift register means equals a predetermined vector word, and means coupled to the decode signal and the outputs of a plurality of predetermined stages of the shift register means for generating a feedback signal coupled to the serial input of the shift register means to short cycle the sequencer means. Each of said pseudo-random number generators comprises a register means for loading an initial vector word into the shift register means. The feedback signal generating means comprises an exclusive-OR gate. The P-code generator further comprises means for generating an X1 signal by performing a modulo-2 sum on an output of a first one and an output of a second one of the plurality of generators, means for generating an X2 signal by performing a modulo-2 sum on an output of a third one and an output of a fourth one of the plurality of generators, and means for generating the P-code by performing a modulo-2 sum on the generated X1 signal and the generated X2 signal.

In accordance with a further feature of the invention a method of generating a sequence in a pseudo-random number generator comprising the steps of providing a shift register means with a serial input and a serial output, the shift register means having a plurality of stages and shifting in accordance with an input signal, generating a decode signal when the contents of the shift register means equals a predetermined vector word, generating a feedback signal based on the decode signal and the outputs of predetermined stages of the plurality of stages, and coupling the feedback signal to the serial input of the shift register means to perform short cycling of the pseudo-random number generator. The method comprises the step of loading a predetermined initial vector word into the shift register means. In such method the step of generating said feedback signal comprises coupling the decode signal and the outputs of predetermined stages of the plurality of stages to an exclusive-OR gate.

In accordance with a further feature of the invention a method of generating a ranging P-code of a Global Positioning System is provided comprising the steps of generating sequences of pseudo-random numbers with a plurality of pseudo-random number generators, each of the generators having a sequencer means for determining the P-code, providing a shift register means in each of the sequencer means for shifting a vector word in accordance with an input signal, the shift register means having a plurality of stages, a serial input and a serial output, generating a decode signal with a decoder means coupled to an output of each stage of the shift register means when the contents of the shift register equals a predetermined vector word, generating a feedback signal based on the decode signal and the outputs of predetermined stages of the plurality of stages of the shift register means, and coupling the feedback signal to the serial input of the shift register means to perform short cycling of the sequencer means. The method comprises the step of loading a predetermined initial vector word into the shift register means of each of the plurality of pseudo-random number generators. In such method the step of generating the feedback signal comprises coupling the decode signal and the outputs of predetermined stages of the plurality of stages to an exclusive-OR gate.

BRIEF DESCRIPTION OF THE DRAWINGS

Other and further features of the invention will become apparent in connection with the accompanying drawings wherein.

DESCRIPTION OF THE PREFERRED EMBODIMENT

Figure 1:
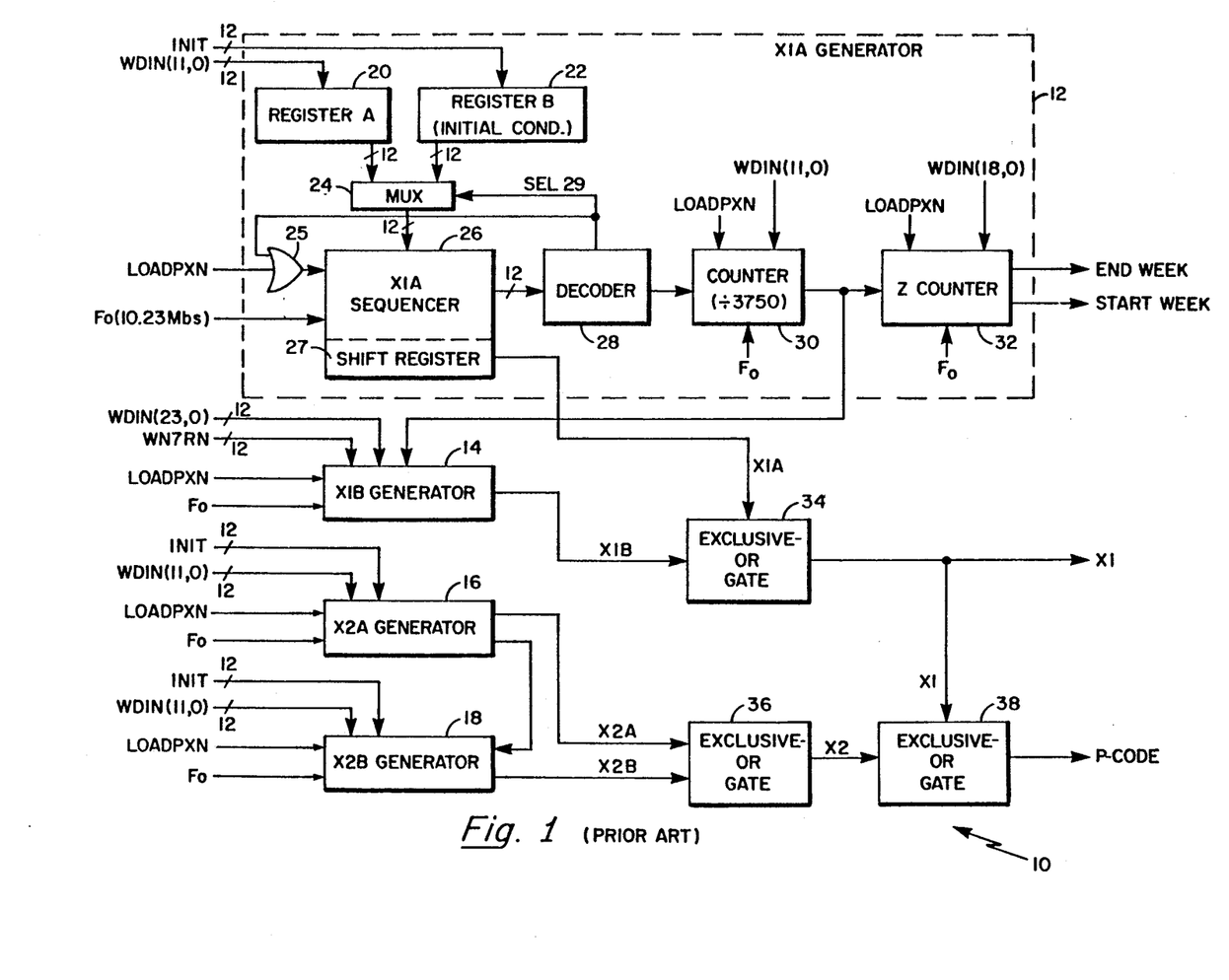
FIG. 1 is a block diagram of a conventional P-code generator comprising four generators X1A, X2A, X1B and X2B, each of the generators having a sequencer with two registers and a multiplexer coupled to the input of the sequencer.

Referring now to FIG. 1, a block diagram of a conventional P-code generator 10 is shown for producing a 10.23 Mbps P-code pattern $P_i(t)$ by a modulo-2 summation of two pseudo-random number codes X1 and X2 or X1(t) and X2(t-it) respectively where "t" is the period of one P-code bit or chip (as in spread spectrum parlance) and "i" is an integer of 1 through 37 which allows the generation of 37 unique P-code phases. The P-code is a ranging code and it is actually a 7 day segment of a 267 day-long code which has a chipping rate of 10.23 Mbps. The 7 day segment is the modulo-2 sum generated by an exclusive-OR gate 38 of two subsequences referred to above as X1 and X2 having lengths of 15,345,000 chips and 15,345,037 chips respectively. The X1 chips are produced by the modulo-2 sum of X1A and X1B signals produced by an X1A generator 12 and an X1B generator 14 respectively coupled to exclusive-OR gate 34. Similarly, the X2 chips are produced by the modulo-2 sum of X2A and X2B signals produced by an X2A generator 16 and an X2B generator 18 respectively coupled to exclusive-OR gate 36.

Still referring to FIG. 1, the X1A generator 12 comprises an X1A sequencer 26 which is clocked at a 10.23 Mbps rate and has a 12-stage shift register 27 short cycled to 4092 chips. Similarly, the X1B generator 14 comprises an X1B sequencer (not shown) having a 12-stage shift register short cycled to 4093 chips. In addition, the X2A generator 16 and the X2A generator 18 have similar sequencers. All the generators 12-18 are clocked by a 10.23 Mbps signal $F_0$. The state of each generator 12, 14, 16, 18 can be expressed as a vector word which specifies the binary sequence value in the shift register of each generator 12-18. The vector comprises the binary state of each stage of the shift register. The shift direction is from lower stage 1 to higher stage 12. Stage 12 provides a serial output. The vector represents the present output and 11 future outputs in sequence. A decoder 28 coupled to the output of the X1A sequencer 26 detects when the 4092 chip has occurred and provides a signal to a divide-by 3750 counter 30. The natural 4095 chip cycles of the 12-stage shift register 27 are shortened by omitting the last three chips of the natural 4095 chip sequence to cause precession of the X1B sequence with respect to the X1A sequence during subsequent cycles of the X1A sequence in the X1 period. Reinitialization of the 12-stage shift register 27 in the X1A sequencer occurs when the decoder 28 generates a select (SEL) signal 29. In a similar manner, the X1B generator 14 comprises an X1B sequencer which includes a 12-stage shift register that is short cycled to 4093 chips, thereby, omitting the last two chips of the natural 4095 chip X1B sequence. This results in the phase of the X1B sequence lagging by one chip for each X1A cycle in the X1 period. The X1 period comprises 3750 X1A cycles (15,345,000) chips which is not an integer number of X1B cycles. In order to accommodate this situation, the X1B shift register is held in the final state (4093) of its 3749th cycle. It remains in this state until the X1A shift register completes its 3750th cycle (343 additional chips). The completion of the 3750th X1A cycle causes the reinitialization of both the X1A and X1B shift registers starting a new X1 cycle. Such reinitialization is accomplished by storing an initialization vector in a 12-bit Register B 22, and the outputs of Register B 22 are coupled to a multiplexor 24. Also, coupled to multiplexor 24 are the outputs from a 12-bit Register A which is used to load different vectors upon initialization or for acquisition or tracking modes. Register A contains a vector associated with an index from 1 to 4095 that is determined from time of day and time of week. Register A is updated during a search mode to acquire a GPS signal; register A is updated during a tracking mode due to doppler shifts. Also, Register A is updated to multiplex from one satellite track to another and back again. The 12-bit Register B 22 and multiplexor 24 are required at the input to the sequencers of each of the X1A, X1B, X2A and X2B generators 12-18 in order to load the proper initialization vector for reinitialization, which requires a fair amount of circuitry. If this reinitialization could be accomplished without the circuitry required for the 12-bit register B 22 and multiplexor 24 in each of the generators 12-18, then the implementation of a complete signal processor on a single VLSI circuit is more feasible. Such a reduction in circuitry will be described hereinbelow for a P-code generator in the signal processor for implementation on a single VLSI circuit.

Figure 2A:
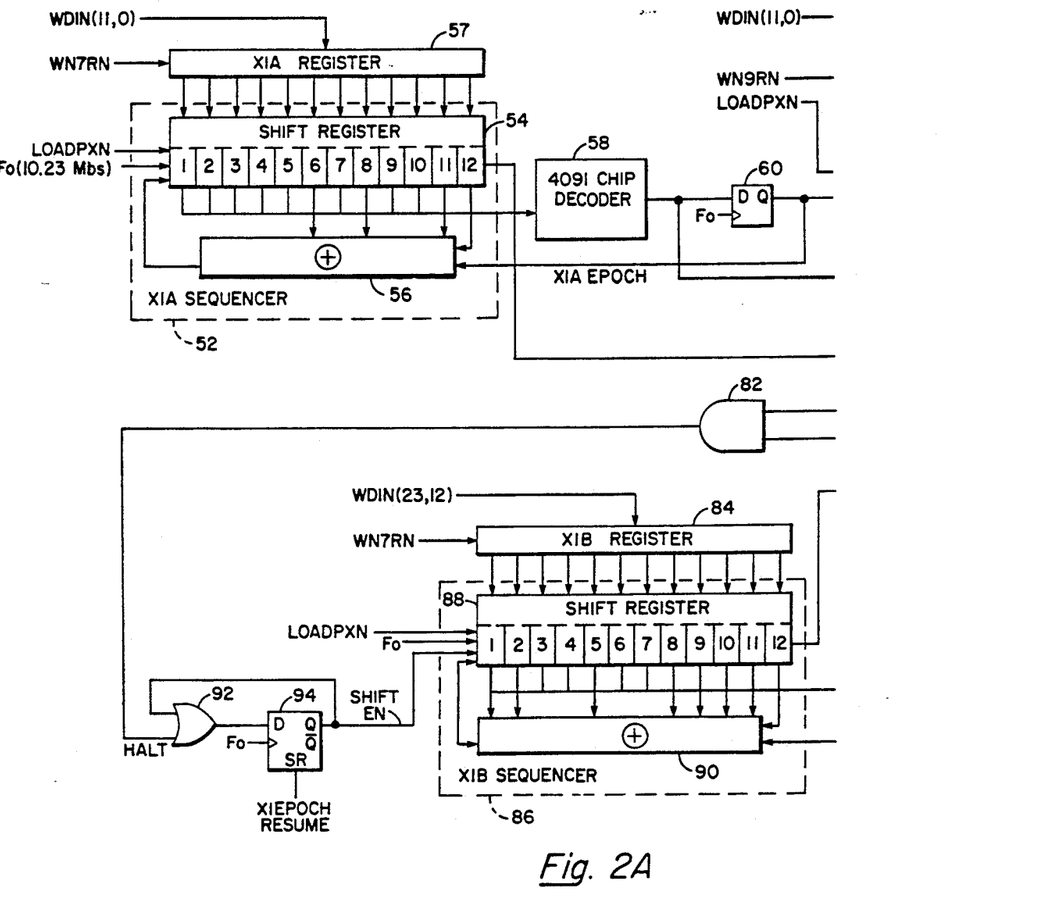
FIGS. 2A and 2B form a logic-block diagram of the X1 portion of the invention for generating a P-code.
Figure 2B:
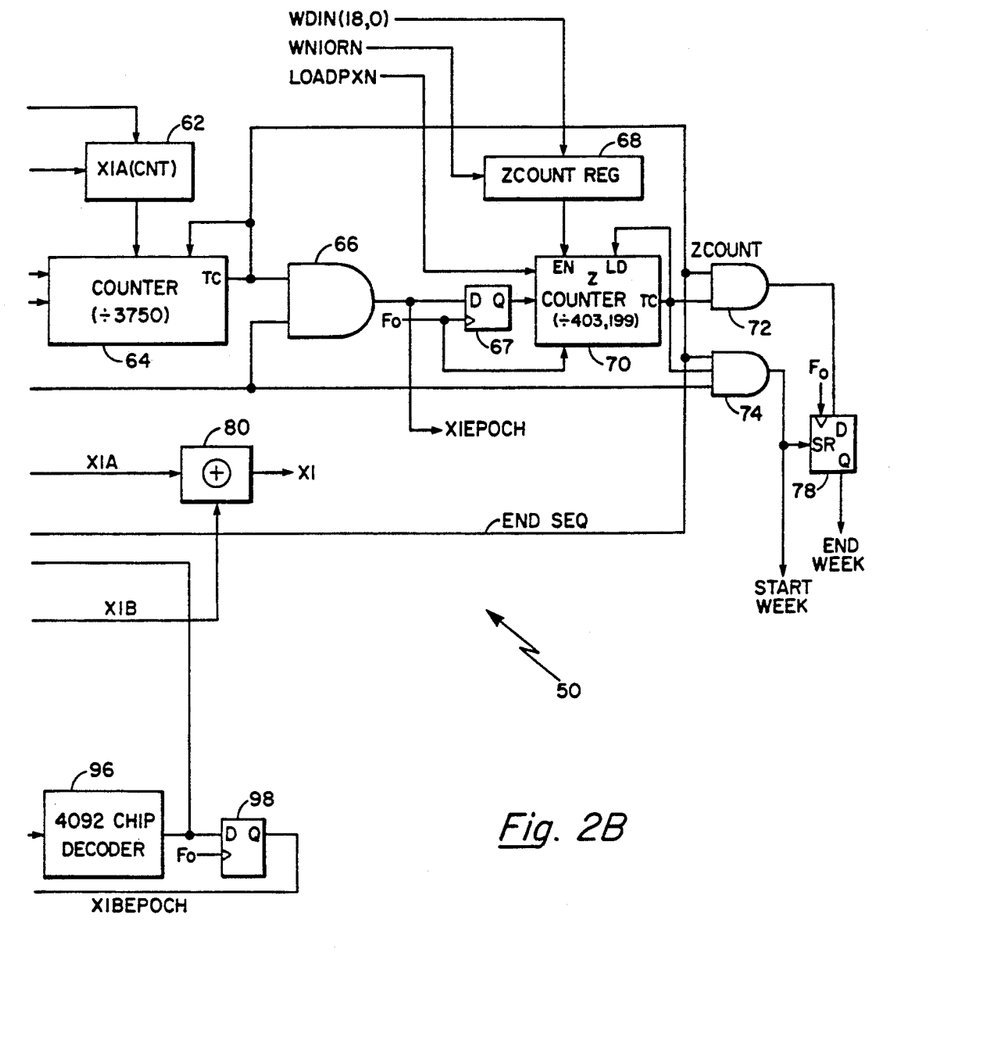
Figure 3A:
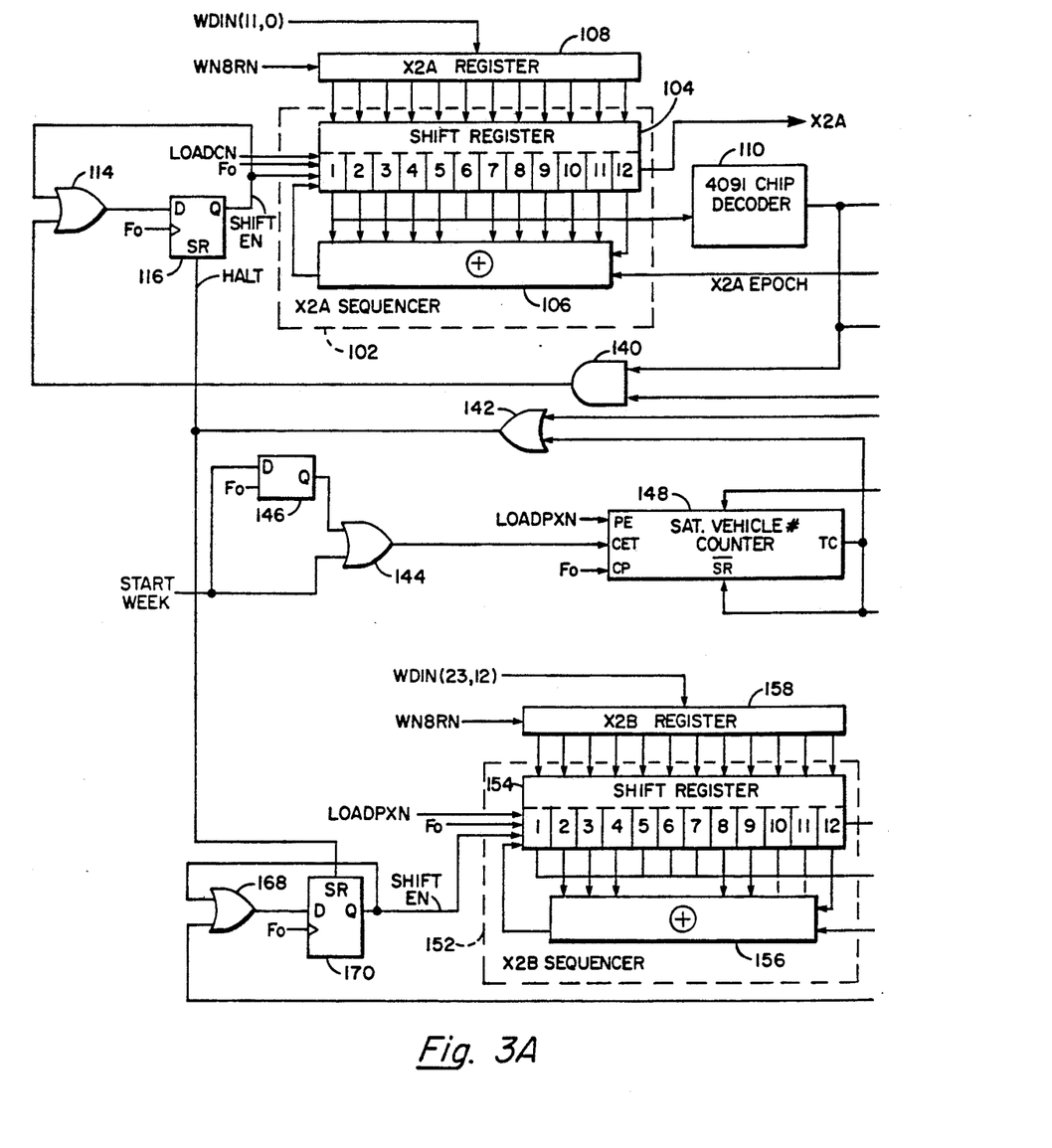
FIGS. 3A and 3B form a logic-block diagram of the X2 portion of the invention including the logic for generating the P-code.
Figure 3B:
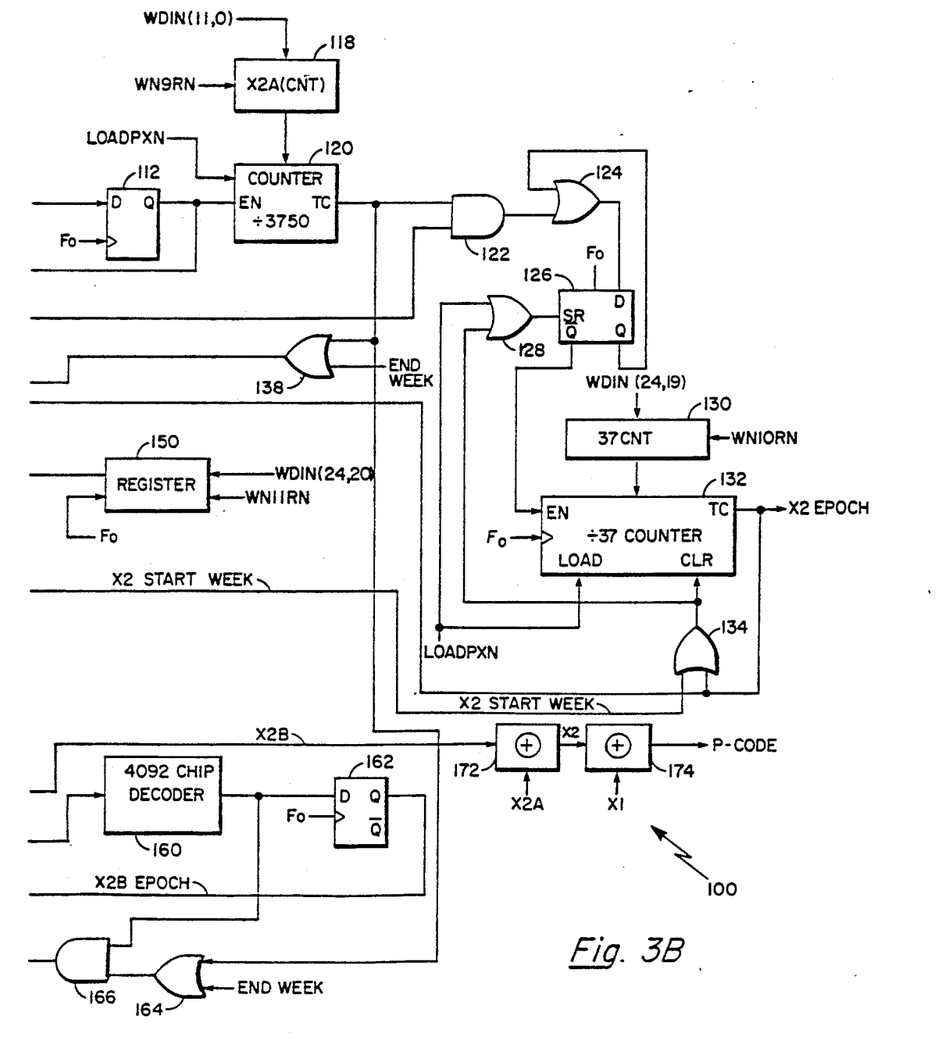
Figure 4A:
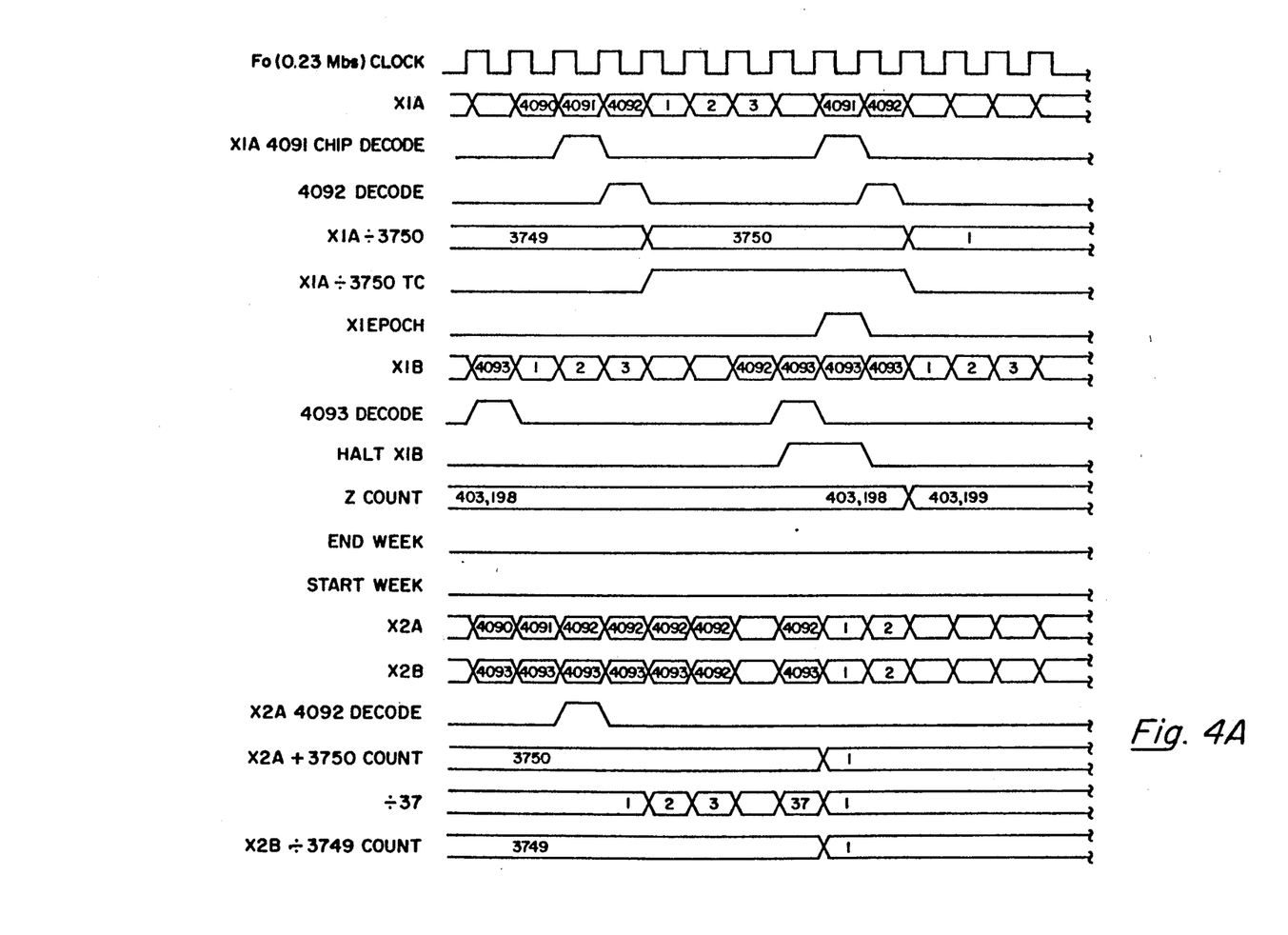
FIG. 4A and FIG. 4B in combination form a timing diagram of the P-code generator.
Figure 4B:
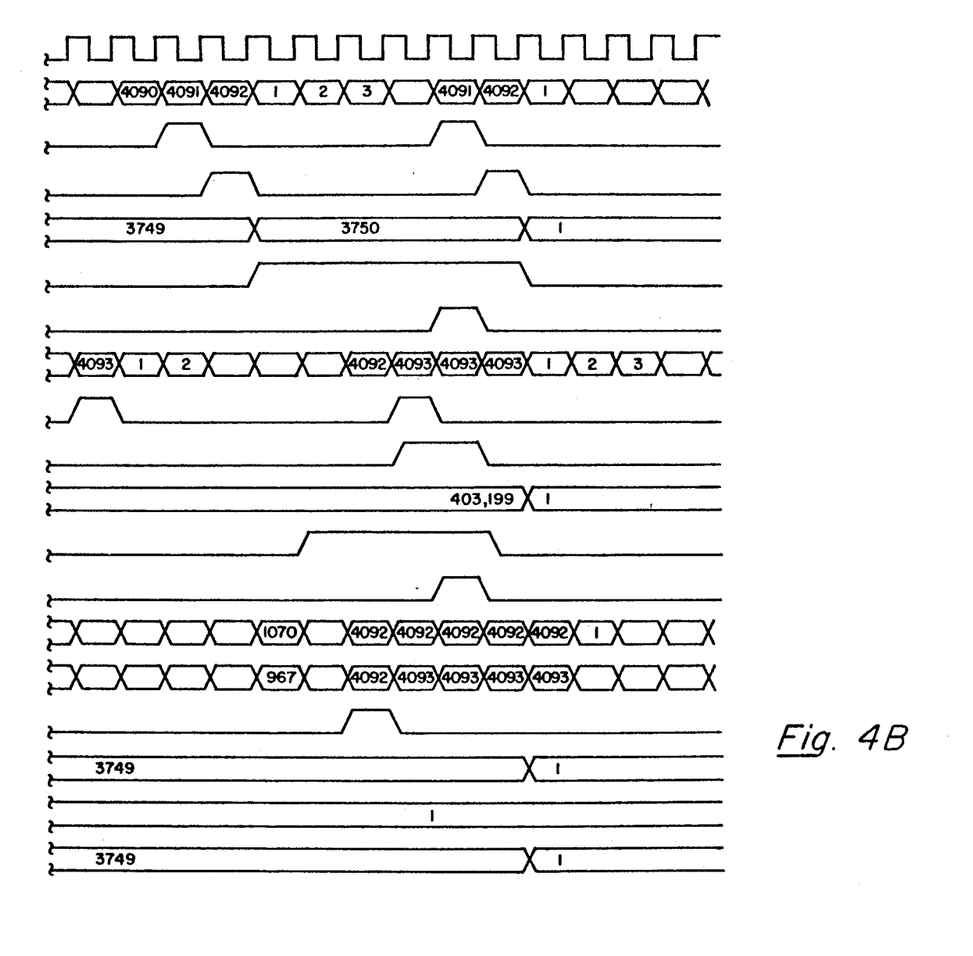

Referring now to FIGS. 2A and 2B, FIGS. 3A and 3B and FIGS. 4A and 4B, there is shown a P-code generator and its timing diagram according to applicant's invention. FIGS. 2A and 2B form a logic-block diagram of the X1 generator 50 portion of the invention, and FIGS. 3A and 3B form a logic-block diagram of the X2 portion of the invention including the logic for generating the P-code. In FIGS. 2A and 2B the X1A generator portion of the X1 generator 50 comprises an X1A sequencer 52 having a 12-stage shift register 54 short cycled from 4095 to 4092 states or chips. The outputs of the shift register 54 stages are coupled to a 4091 chip decoder 58. The outputs of a 12-bit X1A register 57 are coupled to the inputs of the shift register 54 stages for preloading the shift register 54 with an initial vector word and for loading other vectors during search and tracking modes. The initial vector word for the shift register 54 is 001001001000. When the X1A sequencer 52 reaches the index 4092, the vector word stored in shift register 54 is 000100100100 as shown in Table 2. By shifting the shift register 54 on the next $F_0$ clock pulse and ensuring that stage 1 contains a zero by means of exclusive-OR gate 56, the shift register 54 now contains its initial vector word and thus short cycling has occurred. Selected outputs or taps from stages of the shift register 54 are coupled to the exclusive-OR gate 56 which has its output coupled to the serial input of stage 1 of shift register 56. For the X1A sequencer 52, taps from stages 6, 8, 11 and 12 coupled to exclusive-OR gate 56 along with a 4092 decode signal labeled X1A-EPOCH. The 4092 decode signal (X1AEPOCH) is generated by the decoding of the 4091 state of shift register 54 and coupling this output to D flip-flop 60 which provides a one clock period delay before generating the 4092 decode or X1AEPOCH signal at the occurrence of the 4092 state or index in the X1A sequencer 52 as shown in FIGS. 4A and 4B. The actual 4091 decode is performed to allow all counters and registers in the P-code generator to have synchronous resets. The following polynomial expression describes the short cycling of shift register 54 as referenced to its input in the X1A generator in accordance with the present invention:

$$X1A = 1 + X6 + X8 + X11 + X12 + 4092 \text{ DECODE}$$

The 4092 decode signal or X1AEPOCH is coupled to counter 64 which is a divide-by 3750 counter. A register X1A (CNT) 62 is coupled to the inputs of counter 64 for preloading such counter. The output of counter 64 is coupled to AND gate 66 which generates an X1EPOCH signal. The X1EPOCH is defined as 3750 X1A cycles or $3750 \times 4092 = 15,345,000$ chips. The X1EPOCH signal is clocked into D-flip-flop 67 which is coupled to Z counter 70. The Z counter 70 is a divide-by 403,199 counter and permits easy resetting of the P-code generator sequences at the end of a week. The X1EPOCH signals occur every 1.5 seconds and are counted by the Z counter 70. Hence, 1.5 sec $\times$ 403,200 X1EPOCH signals = 1 week. During the last X1EPOCH of the week, the terminal count (TC) of the divide-by 403,199 counter 70 becomes active. When the divide-by 3750 counter 64 is reset to 1, it counts the next 3750 X1AEPOCH signals when the terminal count of the divide-by 3750 goes active. AND-gate 72 generates an END WEEK signal when the divide by 3750 counter 64 and the divide-by 403,199 Z counter 70 both have their respective terminal counts (TC) active. A START WEEK signal is generated by AND-gate 74. An END WEEK register 78 is synchronously reset by the START WEEK signal which is a one-chip long signal as shown in FIG. 4. The outputs of the 4091 chip decoder 58, counter 64 and Z counter 70 are coupled to AND-gate 74. When the X1A sequencer 52 reaches its 4092 count and both the counter 64 and Z counter 70 have active terminal count outputs, the AND-gate 74 generates the START WEEK signal which causes the P-code generator to roll-over to the initial starting vectors in the X1A, X1B, X2A and X2B sequencers 52, 86, 102, 152 of the P-code generator.

Still referring to FIGS. 2A and 2B, the X1B generator portion of the X1 generator 50 comprises an X1B sequencer 86 having a 12-stage shift register 88 which is short cycled from 4095 to 4093 states, indexes or chips. The outputs of the shift register 88 stages are coupled to a 4092 chip decoder 96. The inputs of the shift register 84 stages are coupled to the outputs of an X1B register 84 for preloading the shift register 88 with an initial vector word and for loading other vectors during search and tracking modes. The initial vector word for the shift register 88 is 010101010100. When the X1B sequencer 88 reaches the index of 4093, the vector word stored in shift register 88 is 001010101010 as shown in Table 2. By shifting the shift register 88 on the next $F_0$ clock pulse and ensuring that stage 1 contains a zero by means of exclusive-OR gate 90, the shift register 88 now contains its initial vector word and thus short cycling has occurred. The selected outputs of the shift register 88 stages are coupled to the exclusive-OR gate 90 which has its output coupled to the serial input of stage 1 of shift register 88. For the X1B sequencer 86, taps from stages 1, 2, 5, 8, 9, 10, 11 and 12 are coupled to exclusive-OR gate 90 along with a 4093 decode signal labeled X1BEPOCH. The 4093 decode signal (X1BEPOCH) is generated by the decodings of the 4092 state shift register 54 and coupling this output to D-flip-flop 98 which provides a one clock period delay before generating the X1BEPOCH signal at the occurrence of the 4093 state or index in the X1B sequencer 86. The following polynomial expression describes the short cycling of shift register 88 as referenced to its input in the X1B sequencer 86 in accordance with the present invention:

$$X1B = 1 + X1 + X2 + X5 + X8 + X9 + X10 + X11 + X12 + 4093 \text{ DECODE}$$

The X1B shift register 88 is held in a final state (4093) of its 3749th cycle by the HALT signal from the output of AND-gate 82. This is accomplished when the divided-by 3750 terminal count from counter 64 is active, and then 343 chips later (4092-3749), the 4092 chip decoder 96 of the X1B generator goes active (high). This causes the HALT signal generated by AND-gate 82 to go active (high) which sets D-flip-flop register 94 causing the disabling of the shift enable signal, SHIFT EN (active low). The X1B sequencer 86 stops in its final state (4093) until the X1EPOCH signal clears the register 94 and enables the shift register 88. An OR-gate 92 coupled to register 94 keeps the shift register 88 disabled for more than one clock cycle since the HALT signal came from the 4092 decoder 96 which goes away at state 4093, the desired state to be held. The X1A output from the X1A sequencer 52 is coupled to exclusive-OR gate 80 along with the X1B output from the X1B sequencer 86 for generating X1 which is the modulo-2 sum of the X1A and X1B signals.

Referring now to FIGS. 3A and 3B and FIGS. 4A and 4B, the X2 generator 100 is shown comprising an X2A generator having a short cycled X2A sequencer 102 and an X2B generator having a short cycled X2B sequencer 152. Both of said X2A and X2B sequencers function similarly as the X1A sequencer 52, and X1B sequencer 86 described hereinbefore. The X2A generator comprises the X2A sequencer 102 having a 12-stage shift register 104 short cycled to 4092 states or indexes. The outputs of the shift register 104 stages are coupled to a 4091 chip decoder 110. A 12-bit X2A register 108, coupled to the inputs of the shift register 104 stages, provides for preloading the shift register 104 with an initial vector word and for loading other vectors during search and tracking modes. The initial vector word for the shift register 104 is 100100100101. When the X2A sequencer 102 reaches the index 4092, the vector word stored in shift register 104 is 110010010010 as shown in Table 2. By shifting the shift register 104 on the next $F_0$ clock pulse and ensuring that stage 1 contains a 1 by means of exclusive-OR gate 106, the shift register 104 now contains its initial vector word; hence, short cycling has occurred. Selected outputs or taps from the shift register 104 stages are coupled to the exclusive-OR gate 106 which has its output coupled to the serial input of stage 1 of shift register 104 which is clocked at 10.23 Mbs. The taps from stages 1, 3, 4, 5, 7, 8, 9, 10, 11 and 12 are coupled to the exclusive-OR gate 106 along with a 4092 decode signal labeled X2AEPOCH. The 4092 decode signal (X2AEPOCH) is generated by the decoding of the 4091 state of shift register 104 and coupling this output to D-flip-flop 112 which provides a one clock period delay before generating the X2AEPOCH signal at the occurrence of the 4092 state or index in the X2A sequencer 102. The following polynomial expression describes the short cycling of shift register 104 as referenced to its input in the X2A sequencer 102 in accordance with the present invention:

$$X2A = 1 + X1 + X3 + X4 + X5 + X7 + X8 + X9 + X10 + X11 + X12 + 4092 \text{ DECODE}$$

The 4092 decode signal, X2AEPOCH, is coupled to counter 120 which is a divide-by 3750 counter. A register X2A (CNT) 118 is coupled to the stage inputs of counter 120 for preloading such counter. The output of counter 120 and 4091 chip decoder 110 are gated by AND-gate 122 which causes the delay of the X2EPOCH signal by 37 clock counts. This stretches the X2 generated code 37 chips longer than the X1 code. The OR-gate 124 ensures that the divided-by 37 counter 132 stays enabled until it is reset by the X2EPOCH signal. The OR-gate 128 allows resetting by any LOADPXN signal which means that when the P-code generator is re-initialized, it might not be re-initialized to a state that is at a state which requires the divided-by 37 counter 132 to be counting. An OR-gate 138 allows either the END WEEK signal or the divided-by 3750 counter 120 TC to halt the X2A sequencer 102. The X2A sequencer 102 is halted at the end of an X2EPOCH for 37 clock counts and at the END OF WEEK for a much longer period of time. An OR-gate 164 performs the same function for the X2B sequencer 152. OR-gate 114 coupled to D-flip-flop 116 and OR-gate 168 coupled to D-flip-flop 170 provide the means for halting of the shift registers 104 and 154 by removing the shift enable (SHIFT EN) signals (active low) which are coupled to such shift registers 104, 154.

Still referring to FIGS. 3A and 3B, the X2B generator portion of the X2 generator 100 comprises an X2B sequencer 152 having a 12-stage register 154 which is short cycled to 4093 states or chips. The outputs of the shift register 154 stages are coupled to a 4092 chip decoder 160. The inputs of the shift register 154 are coupled to the outputs of an X2B register 158 for preloading the shift register 154 with an initial vector word and for loading other vectors during search and tracking modes. The initial vector word for the shift register 154 is 010101010100. When the X2B sequencer 152 reaches the index 4093, the vector word stored in shift register 154 is 001010101010 as shown in Table 2. By shifting the shift register 154 on the next $F_0$ clock pulse and ensuring that stage 1 contains a zero by means of exclusive-OR gate 156, the shift register 154 now contains its initial vector word; hence, short cycling has occurred. Selected outputs or taps from the shift register 154 are coupled to the exclusive-OR gate 156 which has its output coupled to the serial input of stage 1 of shift register 154. For the X2B sequencer 152, taps from stages 2, 3, 4, 8, 9 and 12 are coupled to exclusive-OR gate 156 along with a 4093 decode signal labeled X2BEPOCH. The 4093 decode signal (X2BEPOCH) is generated by the decoding of the 4092 state of shift register 154 and coupling this output to D-flip-flop 162 which provides a one clock period delay before generating the X28EPOCH signal at the occurrence of the 4093 state or index in the X2B sequencer 152. The following polynominal expression describes the short cycling of shift register 154 as referenced to its input in the X2B sequencer 152 in accordance with the present invention:

$$X2B = 1 + X2 + X3 + X4 + X8 + X9 + X12 + 4093 \text{ DECODE}$$

The X2A output from the X2A sequencer 102 is coupled to exclusive-OR gate 172 along with the X2B output from the X2B sequencer 152 for generating X2 which is the modulo-2 sum of the X2A and X2B signals. The X2 signal is then coupled to exclusive-OR gate 174 along with the X1 signal generated by exclusive-OR gate 80 to generate the P-code which is the modulo-2 sum of the X1 and X2 signals.

The P-codes for the NAVSTAR GPS satellites are particular to each satellite. For example, an X2 code for satellite 1 delayed with respect to an X1 code by 1 chip; for satellite 5 an X2 code is delayed with respect to an X1 code by 5 chips. This delay only comes at the start of the week. The X2A sequencer 102 and the X2B sequencer 152 are held from shifting by delaying the START of WEEK signal by the satellite number. The START of WEEK signal resets the X1A sequencer 52 and X1B sequencer 86, while the X2A sequencer 102 and the X2B sequencer 152 are held at stages 4091 and 4092 respectively. The sat vehicle # counter 148 counts up to the satellite number for which the P-code is set to emulate, and then the X2A and X2B sequencers 102, 152 are reset to continue counting. Register 150 is coupled to counter 148 to initialize to the sat vehicle # counter 148; hence, its TC is inactive (low). When the START WEEK signal occurs, the sat vehicle # counter 148 is enabled and starts counting. The OR-gate 144 and the D-flip-flop 146 keep the sat vehicle # counter 148 enabled because the START WEEK signal is active for only 1 clock pulse.

Referring now to FIGS. 2A and 2B, FIGS. 3A and 3B, Table 1 and Table 2, Table 1 shows the state vector sequence and a corresponding index that is followed by the X1A sequencer 52 with the initial vector of the sequence being 001001001000 (where the most significant bit (MSB) is to the left and the least significant bit (LSB) is to the right). The initial vector is loaded into the shift register 54 via X1A register 57. The 10.23 Mbs clock ($F_0$) indexes the X1A sequencer 56 through a plurality of states which amounts to 4092 states or indexes for the X1A sequencer 52 because of short cycling before it returns normally to index 1. Short cycling causes the sequencer 52 to return to the initial vector state (index 1) after 4092 indexes instead of after 4095 indexes. In the prior art, it was necessary to load an initial vector into shift register 54 after 4092 indexes. However, in accordance with the present invention, a 4092 decode signal (X1AEPOCH) is fed back to the exclusive-OR gate 56 along with the predetermined stage taps and the output of exclusive-OR gate 56 causes the shift register 54 to assume the initial vector state, which in X1A sequencer 52 is 001001001000, without the need for any additional circuitry to load the desired initial vector state. Table 1 shows the short cycling occurring after the 4092 index resulting in the next index after 4092 being index 1 with the correct initial vector loaded in shift register 54. Table 2 shows the initial vectors for each one of the X1A, X1B, X2A, X2B generators and a portion of the sequences through the 4095 indexes along with the P-code that is generated at each index. However, the X1A sequencer 56 and the X2A sequencer 106 are short cycled at the 4092 index and the X1B sequencer 86 and the X2B sequencer 152 are short cycled at the 4093 index for proper generation of P-codes.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

TABLE 1

| X1A SEQUENCE SHORT CYCLED TO 4092 CHIPS | |
|---|---|
| X1A | INDEX |
| MSB       LSB | |
| 001001001000 | 1 |
| 010010010000 | 2 |
| 100100100000 | 3 |
| 001001000000 | 4 |
| 010010000000 | 5 |
| 100100000000 | 6 |
| 001000000001 | 7 |
| 010000000010 | 8 |
| . | . |
| . | . |
| . | . |
| 111100010010 | 4088 |
| 111000100100 | 4089 |
| 110001001001 | 4090 |
| 100010010010 | 4091 |
| ⌐000100100100¬ | 4092 → SHORT CYCLED TO INDEX 1 |
| 001001001001 | 4093 |
| 010010010010 | 4094 |
| 100100100100 | 4095 |
| 001001001000 | 1 |
| 010010010000 | 2 |
| 100100100000 | 3 |
| 001001000000 | 4 |
| 010010000000 | 5 |

TABLE 2

| P-CODE GENERATOR SEQUENCES | | | | | |
|---|---|---|---|---|---|
| X1A | X1B | X2A | X2B | P-CODE | INDEX |
| MSB       LSB | MSB       LSB | MSB       LSB | MSB       LSB | | |
| 001001001000 | 010101010100 | 100100100101 | 010101010100 | 1 | 1 |
| 010010010000 | 101010101001 | 001001001010 | 101010101000 | 0 | 2 |
| 100100100000 | 010101010010 | 010010010101 | 010101010001 | 1 | 3 |
| 001001000000 | 101010100100 | 100100101011 | 101010100011 | 1 | 4 |
| 010010000000 | 010101001001 | 001001010110 | 010101000111 | 0 | 5 |
| 100100000000 | 101010010011 | 010010101100 | 101010001111 | 1 | 6 |
| 001000000001 | 010100100110 | 100101011000 | 010100011111 | 1 | 7 |
| 010000000010 | 101001001101 | 001010110001 | 101000111110 | 0 | 8 |
| . | . | . | . | . | . |
| . | . | . | . | . | . |
| . | . | . | . | . | . |
| 111100010010 | 001010010101 | 111111001001 | 111000010101 | 1 | 4088 |
| 111000100100 | 010100101010 | 111110010010 | 110000101010 | 1 | 4089 |
| 110001001001 | 101001010101 | 111100100100 | 100000101010 | 0 | 4090 |
| 100010010010 | 010010101010 | 111001001001 | 000010101010 | 0 | 4091 |
| ⌐000100100100¬ | 100101010101 | ⌐110010010010¬ | 000101010101 | 0 | 4092 (DECODE) |
| 001001001001 | ⌐001010101010¬ | 100100100100 | ⌐001010101010¬ | 1 | 4093 (DECODE) |
| 010010010010 | 010101010101 | 001001001001 | 010101010101 | 0 | 4094 |
| 100100100100 | 101010101010 | 010010010010 | 101010101010 | 1 | 4095 |
| 001001001000 | 010101010100 | 100100100101 | 010101010100 | 1 | 1 |

What is claimed is:

1. A P-code generator of a Global Positioning System comprising:
   a plurality of pseudo-random number generators for generating a ranging P-code, each of said generators having a sequencer means for determining said ranging P-code;
   shift register means included in each of said sequencer means comprising a plurality of stages, said shift register means having a serial input port, a serial output port, and shifting in accordance with an input signal;
   decoder means coupled to each stage of said shift register means for generating a decode signal when the contents of said shift register means equals one predetermined vector word; and
   means coupled to an output port of said decoder means and to a plurality of predetermined stages of said shift register means for generating a feedback signal fed to said serial input port of said shift register means to short cycle said sequencer means.

2. The P-code generator as recited in claim 1 wherein:

each of said pseudo-random number generators comprises a register means for loading an initial vector word into said shift register means.

3. The P-code generator as recited in claim 1 wherein:
said feedback signal generating means comprises an exclusive-OR gate.

4. The P-code generator as recited in claim 1 wherein said generator further comprises:
means for generating an X1 signal by performing a modulo-2 sum on an output signal of a first one and an output signal of a second one of said plurality of generators;
means for generating an X2 signal by performing a modulo-2 sum on an output signal of a third one and an output signal of a fourth one of said plurality of generators; and
means for generating said P-code by performing a modulo-2 sum on said generated X1 signal and said generated X2 signal.

5. A method of generating a ranging P-code of a Global Positioning System comprising the steps of:
generating sequences of pseudo-random numbers with a plurality of pseudo-random number generators, each of said generators having a sequencer means for determining said P-code;
providing a shift register means in each of said sequencer means for shifting a vector word in accordance with an input signal, said shift register means having a plurality of stages, a serial input port and a serial output port;
generating a decode signal with a decoder means coupled to each stage of said shift register means when the contents of said shift register equals one predetermined vector word;
generating a feedback signal based on said decode signal and output signals of predetermined stages of said plurality of stages of said shift register means; and
feeding said feedback signal to said serial input port of said shift register means to perform short cycling of said sequencer means.

6. The method as recited in claim 5 comprises the step of:
loading a predetermined initial vector word into said shift register means of each of said plurality of pseudo-random number generators.

7. The method as recited in claim 5 wherein:
said step of generating said feedback signal comprises coupling said decode signal and said output signals of predetermined stages of said plurality of stages to input terminals of an exclusive-OR gate.

8. A P-code generator of a Global Positioning System comprising:
a plurality of pseudo-random number generators for generating a ranging P-code;
sequencer means in each of said pseudo-random number generators for sequencing to a predetermined vector word from a preset initial vector word prior to being short cycled to said initial vector word in accordance with a feedback signal;
means for generating an X1 signal by performing a modulo-2 sum on an output signal of a first one and an output signal of a second one of said plurality of pseudo-random number generators;
means for generating an X2 signal by performing a modulo-2 sum on an output signal of a third one and an output signal of a fourth one of said plurality of pseudo-random number generators; and
means for generating said P-code by performing a modulo-2 sum on said generated X1 signal and said generated X2 signal.

9. The P-code generator as recited in claim 8 wherein:
each of said sequencer means comprises a shift register means preloaded with said initial vector word.

10. The P-code generator as recited in claim 9 wherein:
said sequencer means comprises logic means coupled to predetermined stages of said shift register means and a decode signal for generating said feedback signal being fed to a serial input port of said shift register.

11. A method of generating a ranging P-code of a Global Positioning System comprising the steps of:
generating said ranging P-code with a plurality of pseudo-random number generators, each of said generators having a sequencer means;
sequencing to a predetermined vector word from a preset initial vector word in said sequencer means prior to being short cycled to said initial vector word in accordance with a feedback signal;
generating an X1 signal by performing a modulo-2 sum on an output signal of a first one and an output signal of a second one of said plurality of pseudo-random number generators;
generating an X2 signal by performing a modulo-2 sum on an output signal of a third one and an output signal of a fourth one of said plurality of pseudo-random number generators; and
means for generating said P-code by performing a modulo-2 sum on said generated X1 signal and said generated X2 signal.

12. The method as recited in claim 11 wherein:
said step of sequencing further comprises the step of loading said preset initial vector word into a shift register of said sequencer means.

13. The method as recited in claim 12 wherein:
said sequencing step further comprises the step of coupling predetermined stages of said shift register and a decode signal to logic means for generating said feedback signal fed to a serial input of said shift register.

* * * * *